(12) United States Patent
Ohno et al.

(10) Patent No.: US 8,481,346 B2
(45) Date of Patent: Jul. 9, 2013

(54) METHOD OF ANALYZING IRON CONCENTRATION OF BORON-DOPED P-TYPE SILICON WAFER AND METHOD OF MANUFACTURING SILICON WAFER

(75) Inventors: Ryuji Ohno, Kanagawa (JP); Hisao Iga, Tokyo (JP); Fumio Iga, legal representative, Saitama (JP)

(73) Assignee: Sumco Corporation, Tokyo (JP)

( * ) Notice: Subject to any disclaimer, the term of this patent is extended or adjusted under 35 U.S.C. 154(b) by 92 days.

(21) Appl. No.: 13/191,740

(22) Filed: Jul. 27, 2011

(65) Prior Publication Data
US 2012/0049329 A1 Mar. 1, 2012

(30) Foreign Application Priority Data

Aug. 27, 2010 (JP) ................................. 2010-190398

(51) Int. Cl.
*H01L 21/66* (2006.01)
(52) U.S. Cl.
USPC .................................... 438/18; 257/E21.531
(58) Field of Classification Search
USPC .................................... 438/11; 257/E21.529
See application file for complete search history.

(56) References Cited

U.S. PATENT DOCUMENTS

| | | | | |
|---|---|---|---|---|
| 5,742,176 A | * | 4/1998 | Kato et al. | 324/762.05 |
| 7,141,992 B2 | * | 11/2006 | Ohno et al. | 324/762.05 |
| 7,244,306 B2 | * | 7/2007 | Kurita et al. | 117/13 |
| 2006/0066324 A1 | | 3/2006 | Ohno et al. | |

FOREIGN PATENT DOCUMENTS

| | | |
|---|---|---|
| JP | 2005-064054 | 3/2005 |
| JP | 2005-317562 | 11/2005 |

* cited by examiner

*Primary Examiner* — Chandra Chaudhari
(74) *Attorney, Agent, or Firm* — Greenblum & Bernstein, P.L.C.

(57) ABSTRACT

An aspect of the present invention relates to a method of analyzing an iron concentration of a boron-doped p-type silicon wafer by a SPV method, which comprises subjecting the wafer to Fe—B pair separation processing by irradiation with light and determining the iron concentration based on a change in a minority carrier diffusion length following the separation processing. The iron concentration is calculated with a calculation equation comprising a minority carrier diffusion length $L_{AF1}$ measured after the separation processing, a minority carrier diffusion length $L_{AF2}$ measured after a prescribed time has elapsed following measurement of $L_{AF1}$, and dependence on time of recombination of Fe—B pairs separated by the separation processing. The calculation equation is derived by assuming that the irradiation with light causes boron atoms and oxygen atoms in the wafer to form a bonded product, and by assuming that the bonded product has identical influences on $L_{AF1}$ and $L_{AF2}$.

5 Claims, 5 Drawing Sheets

METHOD OF ANALYZING IRON CONCENTRATION OF BORON-DOPED P-TYPE SILICON WAFER AND METHOD OF MANUFACTURING SILICON WAFER

CROSS-REFERENCE TO RELATED APPLICATIONS

This application claims the benefit of priority under 35 USC 119 to Japanese Patent Application No. 2010-190398, filed on Aug. 27, 2010, which is expressly incorporated herein by reference in its entirety.

BACKGROUND OF THE INVENTION

1. Field of the Invention

The present invention relates to a method of analyzing an iron concentration of a boron-doped p-type silicon wafer. More particularly, the present invention relates to an analysis method permitting the obtaining with high precision of the iron concentration of a boron-doped p-type silicon wafer by the surface photovoltage method (SPV method).

The present invention further relates to a method of manufacturing a boron-doped p-type silicon wafer with reduced iron contamination, and a silicon wafer with a written quality guarantee obtained based on the above analysis method.

2. Discussion of the Background

The heavy metal contamination of a silicon wafer negatively affects the device characteristics of the finished product. In particular, even a trace quantity of Fe contamination in a wafer functions as a recombination center, causing an increase in the amount of reverse leakage at pn junctions in devices and causing the failure of memory refreshment and the like in memory elements. Accordingly, it is required to accurately determine the level of Fe contamination of wafers for process management.

In boron-doped p-type silicon, electrostatic forces cause the Fe to bond with the boron, forming a Fe—B pair. The surface photovoltage method (SPV method), which utilizes a change in the measurement value of a minority carrier diffusion length before and after the separation of the Fe—B pair, is widely employed as a method of quantifying the concentration of iron in boron-doped p-type silicon wafers (for example, see Japanese Unexamined Patent Publication (KOKAI) No. 2005-64054, Japanese Unexamined Patent Publication (KOKAI) No. 2005-317562 as well as English language family member US2006/063324A1 and U.S. Pat. No. 7,141,992, which are expressly incorporated herein by reference in their entirety).

The SPV method is currently widely employed as a process management method and quality assurance method to stably provide high-quality boron-doped p-type silicon wafers with little iron contamination. The SPV method is a good method that permits automated measurement without requiring a high level of skill in the manner of chemical analysis. However, there is a need to further raise the analysis precision to provide higher quality silicon wafers.

SUMMARY OF THE INVENTION

An aspect of the present invention provides for a means of measuring the iron concentration of a boron-doped p-type silicon wafer with high precision utilizing the SPV method.

The present inventors conducted extensive research, resulting in the following discoveries.

Fe and B bond, forming Fe—B pairs in boron-doped p-type silicon wafers. However, irradiation with light and the like causes the Fe—B pair to dissociate into interstitial Fe and substitutional B. The SPV method is a method that utilizes the fact the influence of the Fe—B pair on the minority carrier diffusion length is greatly different from that of the interstitial Fe to determine the iron concentration of a boron-doped p-type silicon wafer (also referred to simply as a "silicon wafer" or "wafer", hereinafter) based on the difference in the measurement value of the minority carrier diffusion length before and after separation processing of Fe—B pairs (during bonding of Fe—B pairs and during separation). The SPV method is premised on that the separation of Fe—B pairs is only a phenomenon produced by separation processing. However, a research conducted by the present inventors revealed that when measurement was conducted based on the above premise, the following error factors caused the measurement precision to drop markedly.

Fe—B pair separation processing in the SPV method is primarily conducted by irradiation with light. However, in the field of solar cells, it is reported that oxygen atoms (interstitial oxygen) that are necessarily introduced as a result of the manufacturing process and doped boron atoms in the silicon bond as a result of irradiation with light, forming B—O defects (two oxygens being bonded to one boron) (see Schmidt et al., "Progress in Understanding and Reducing the Light Degradation of CZ Silicon Solar Cells," the 16th European Photovoltaic Solar Energy Conference, Glasgow, May 1-5, 2000, which is expressly incorporated herein by reference in its entirety). The presence of these B—O defects changes the measurement result (the minority carrier diffusion length is decreased by the presence of B—O defects). When the presence of the B—O defects is ignored and the iron concentration is determined from the change in the measurement values before and after separation of Fe—B pairs while disregarding the formation of B—O defects by irradiation with light, the iron concentration that is calculated ends up being increased by the amount of the B—O defects that have been formed.

In this regard, the present inventors noted that the B—O defects that were generated remained present in stable form following their generation. That is, the effect of the B—O defects formed by irradiation with light that was exerted on the measurement value of the minority carrier diffusion length could be viewed as not changing over time. Accordingly, by taking into account the constant effect of the B—O defects on the minority carrier diffusion length, it becomes possible to measure the iron concentration with greater precision than by the conventional method in which this is not taken into account.

Accordingly, it is conceivably possible to utilize the stability of B—O defects in a method of excluding the effect of B—O defects. After forming B—O defects in a wafer being analyzed by irradiation with light, the usual SPV method could be employed, after restoring Fe—B pairs separated by the irradiation with light, to measure the iron concentration again based on the difference in the measurement values of the minority carrier diffusion length when Fe and B were bonded in pairs and when they were separated. Although the above method would make it possible to measure the iron concentration with high precision by eliminating the effect of B—O defects, it would be necessary to allow the wafer being analyzed to stand until the Fe—B pairs were restored (for example, one hour to one day). Thus, analysis would take a long time. By contrast, the present inventors discovered that if the dependence on time of the recombination of Fe—B pairs was calibrated, it was possible to analyze the iron concentration with high reliability while reducing or eliminating the effect of the B—O defects without having to wait for restoration of the Fe—B pairs.

The present invention was devised based on that discovery.

An aspect of the present invention relates to a method of analyzing an iron concentration of a boron-doped p-type silicon wafer by a surface photovoltage method, which comprises:

subjecting the boron-doped p-type silicon wafer to Fe—B pair separation processing by irradiation with light, and determining the iron concentration based on a change in a minority carrier diffusion length following the Fe—B pair separation processing, wherein the iron concentration is calculated with a calculation equation, the calculation equation comprising parameters in the form of a minority carrier diffusion length $L_{AF1}$ measured after the separation processing, a minority carrier diffusion length $L_{AF2}$ measured after a prescribed time has elapsed following measurement of $L_{AF1}$, and dependence on time of recombination of Fe—B pairs that have been separated by the separation processing, and the calculation equation is derived by assuming that the irradiation with light causes boron atoms and oxygen atoms that are present in the silicon wafer to form a bonded product, and by assuming that the bonded product has identical influences on $L_{AF1}$ and $L_{AF2}$.

The above calculation equation may be the following equation (6):

$$N_{Fe} = \frac{D_n}{F_{AF2} - F_{AF1}} \left( \frac{1}{C_{FeB} - C_{Fei}} \right) \left( \frac{1}{L_{AF1}^2} - \frac{1}{L_{AF2}^2} \right) \quad (6)$$

wherein, in equation (6), $N_{Fe}$ denotes the iron concentration, $F_{AF1}$ denotes the dependence on time of recombination of Fe—B pairs calculated from the following equation (1) at the time of measurement of $L_{AF1}$, $F_{AF2}$ denotes the dependence on time of recombination of Fe—B pairs calculated from the following equation (1) at the time of measurement of $L_{AF2}$, $C_{FeB}$ denotes an electron capture coefficient of Fe—B pairs, $C_{Fei}$ denotes an electron capture coefficient of Fei, and $D_n$, denotes an electron diffusion constant;

$$F = \exp(-\tau_C^{-1} t) \quad (1)$$

wherein, in equation (1), F denotes dependence on time of recombination of Fe—B pairs, τc denotes a capture ratio, and t denotes a passage of time following irradiation with light.

The above method may be conducted with an analysis device comprising a light irradiating part that irradiates the light, a measuring part that measures the diffusion length, and a displacement means that displaces the silicon wafer being analyzed between the measurement part and the light irradiating part.

A further aspect of the present invention relates to a silicon wafer to which a written quality guarantee is attached, wherein an iron concentration determined by the above method of analyzing is recorded on the written quality guarantee.

A still further aspect of the present invention relates to a method of manufacturing a boron-doped p-type silicon wafer, which comprises:

preparing a lot of silicon wafers containing multiple boron-doped p-type silicon wafers;

extracting at least one silicon wafer from the lot;

determining an iron concentration of the silicon wafer that has been extracted by the above method of analyzing; and shipping a silicon wafer as a product wafer, the silicon wafer being within the same lot as the extracted silicon wafer the iron concentration of which has been determined to be at or below a threshold.

The present invention can determine with high precision the concentration of iron in a boron-doped p-type silicon wafer essentially without being affected by B—O defects.

Other exemplary embodiments and advantages of the present invention may be ascertained by reviewing the present disclosure and the accompanying drawing.

BRIEF DESCRIPTION OF THE DRAWINGS

The present invention will be described in the following text by the exemplary, non-limiting embodiments shown in the figure, wherein.

DETAILED DESCRIPTION OF THE EMBODIMENTS

Unless otherwise stated, a reference to a compound or component includes the compound or component by itself, as well as in combination with other compounds or components, such as mixtures of compounds.

As used herein, the singular forms "a," "an," and "the" include the plural reference unless the context clearly dictates otherwise.

Except where otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not to be considered as an attempt to limit the application of the doctrine of equivalents to the scope of the claims, each numerical parameter should be construed in light of the number of significant digits and ordinary rounding conventions.

Additionally, the recitation of numerical ranges within this specification is considered to be a disclosure of all numerical values and ranges within that range. For example, if a range is from about 1 to about 50, it is deemed to include, for example, 1, 7, 34, 46.1, 23.7, or any other value or range within the range.

The following preferred specific embodiments are, therefore, to be construed as merely illustrative, and non-limiting to the remainder of the disclosure in any way whatsoever. In this regard, no attempt is made to show structural details of the present invention in more detail than is necessary for fundamental understanding of the present invention; the description taken with the drawings making apparent to those skilled in the art how several forms of the present invention may be embodied in practice.

An aspect of the present invention relates to a method of analyzing an iron concentration of a boron-doped p-type silicon wafer by a surface photovoltage method.

The analyzing method of the present invention comprises subjecting the boron-doped p-type silicon wafer to Fe—B pair separation processing by irradiation with light, and determining the iron concentration based on a change in a minority carrier diffusion length following the Fe—B pair separation processing. The above iron concentration is calculated with a calculation equation, the calculation equation comprising parameters in the form of a minority carrier diffusion length $L_{AF1}$ measured after the separation processing, a minority carrier diffusion length $L_{AF2}$ measured after a prescribed time has elapsed following measurement of $L_{AF1}$, and dependence on time of recombination of Fe—B pairs that have been separated by the separation processing, and the above calculation equation is derived by assuming that the irradiation with light causes boron atoms and oxygen atoms that are present in the silicon wafer to form a bonded product (B—O defect), and by assuming that the bonded product has identical influences on $L_{AF1}$ and $L_{AF2}$. This essentially makes it possible to exclude the influences of B—O defects formed by irradiation with light, and makes it possible to determine the iron concentration without waiting for restoration of the Fe—B pairs, thereby permitting rapid analysis of the iron concentration with greater reliability.

The analyzing method of the present invention is primarily comprised of the steps of separation processing Fe—B pairs by irradiation with light, measuring the first diffusion length ($L_{AF1}$) after separation processing, measuring the second diffusion length ($L_{AF2}$) after a prescribed period of time has elapsed following measurement of the first diffusion length, and calculating the iron concentration.

The above steps will be sequentially described below.

Separation Processing of Fe—B Pairs

The separation processing of Fe—B pairs can be conducted by optical activation (irradiation with high-energy light such as high-intensity white light) in the usual SPV method. More specifically, monochromatic light having energy equal to or greater than a forbidden band energy of silicon, 1.1 eV, is continuously or intermittently irradiated onto the surface of the silicon wafer being analyzed to separate Fe—B pairs. By way of example, reference can be made to Lagowski, et al., Appl. Phys. Lett., Vol. 63, p. 2902 (1993), which is expressly incorporated herein by reference in its entirety, for the light radiation conditions for separating Fe—B pairs (the brightness of the light irradiated and the period of irradiation). To increase the analysis precision, the light irradiation conditions are desirably determined to produce 100 percent separation of the Fe—B pairs. In the present invention, the iron concentration is determined by assuming that the boron atoms and the oxygen atoms in the silicon wafer form a bonded product (B—O defects) as the result of irradiation with light. It is not necessary to conduct irradiation with light until saturation of the formation of B—O defects occurs. Stopping the irradiation with light can also stop the formation of B—O defects. Since the B—O defects that have been formed can remain stably present, the influence on the diffusion length of the B—O defects can be deemed to remain essentially unchanged. In particular, the B—O defects are highly stable at 0 to 100° C. Thus, the atmospheric temperature desirably falls within a range of 0 to 100° C. in the course of letting the wafer stand and analyzing the wafer following irradiation with light. From the perspective of facilitating operation, allowing the wafer to stand and analyzing the wafer following irradiation with light at room temperature (about 20 to 25° C.) are desirable because temperature controls are not required.

Measuring the Diffusion Lengths $L_{AF1}$, $L_{AF2}$)

Diffusion lengths $L_{AF1}$ and $L_{AF2}$ can be measured following separation processing by the usual SPV method. Reference can be made to Japanese Unexamined Patent Publication (KOKAI) No. 2005-64054, Japanese Unexamined Patent Publication (KOKAI) No. 2005-317562 as well as English language family member US2006/063324A1 and U.S. Pat. No. 7,141,992, and JEITA Standard "JEITA EM-3511 Method of measuring the Fe concentration in a p-type silicon wafer by utilizing the surface photovoltage method", which are expressly incorporated herein by reference in their entirety, and the like for details of diffusion length measurement by the SPV method. The wafer standing period between $L_{AF1}$ measurement and $L_{AF2}$ measurement can be set to a time exhibiting a significant difference in the measurement value of the minority carrier diffusion length taking into account the resistivity of the wafer being analyzed (that is, the boron concentration) and the temperature when standing. For example, in a silicon wafer with a boron concentration of about 1E16 atmos/cm$^2$, letting the wafer stand at room temperature for about 10 to 30 minutes will cause an adequately significant difference to appear in the measurement value of the minority carrier diffusion length before and after standing, and standing at room temperature for from 3 to 4 hours after irradiation with light will result in nearly 100 percent restoration of the separated Fe—B pairs. Further, the wafer can be heated to accelerate restoration of the Fe—B pairs. In that process, the heating temperature is desirably set to the above temperature region (0 to 100° C.) over which the B—O defects are highly stable.

Iron Concentration Calculating Step

In this step, the iron concentration in the wafer being analyzed is calculated by the calculation equation containing parameters in the form of the minority carrier diffusion lengths $L_{AF1}$ and $L_{AF2}$ obtained in the above step and the dependence on time of recombination of the Fe—B pairs that have been separated by the separation processing. The above calculation equation is derived by assuming that irradiation with light causes the boron atoms and oxygen atoms present in the silicon wafer to form a bonded product (B—O defect) and by assuming that the B—O defect formed has the same influence on $L_{AF1}$ and $L_{AF2}$. That is because, since the B—O defects formed by irradiation with light affect the minority carrier diffusion length but are stably present following irradiation with light, their influence can be viewed as remaining unchanged over time. Desirably, as the above calculation equation, a calculation equation is derived that allows the influence of the B—O defects on $L_{AF1}$ and $L_{AF2}$ to be subtracted (a calculation equation that excludes the influence of the B—O defects). Thus, it is possible to determine the iron concentration as a highly reliable calculated value that is unaffected by the B—O defects. Equation (6) derived according to the following procedure is given as an example of such a calculation equation.

The dependence on time of recombination of the Fe—B pairs is obtained from equation (1) below as indicated in equation (4) in Japanese Unexamined Patent Publication (KOKAI) No. 2005-317562.

$$F = \exp(-\tau_C^{-1} t) \quad (1)$$

In equation (1), τc is the capture ratio and can be obtained from equation (a) below. t denotes the passage of time following irradiation with light.

$$\tau_C^{-1} = 4\pi R_C D_{int} N_B \quad (a)$$

In equation (a), $N_B$ denotes the boron concentration of the wafer being analyzed. $R_c$ denotes the Coulomb capture coefficient, and $D_{int}$ denotes the intrinsic diffusion constant of Fe. They can be represented as set forth below. Thus, the dependence F on time of the recombination of Fe—B pairs is determined based on the temperature and boron concentration of the silicon wafer.

$$D_{int} = .074 \times 10^{-3} \exp[-0.67 eV/k_B T] \quad R_C = \frac{q^2}{4\pi \varepsilon_{si} k_B T}$$

In the above, q is the electron charge=1.6E-19[C], $k_B$ is the Boltzmann constant=1.38E-23 (J/K), T is the temperature of the silicon wafer (absolute temperature, identical below), and $\varepsilon_{si}$ is the permittivity of silicon (the relative permittivity of silicon is 12.0).

Additionally, in order to assume that diffusion lengths $L_{AF1}$ and $L_{AF2}$ are identically affected by B—O defects, equations (2) and (3) below can be employed.

First, the minority carrier diffusion length $L_{AF1}$ that is measured when time $t_1$ has elapsed from Fe—B pair separation by irradiation with light (optical activation) is given by equation (2).

$$\frac{1}{L_{AF1}^2} = \frac{(1-f) C_{FeB} N_{Fe}}{D_n} + \frac{f C_{Fei} N_{Fe}}{D_n} + \frac{1}{L_{others}^2} + \frac{1}{L_{BO}^2} \quad (2)$$

The minority carrier diffusion length $L_{AF2}$ that is measured when $t_2$ ($t_1 < t_2$) has elapsed from the optical activation is given by equation (3).

$$\frac{1}{L_{AF2}^2} = \frac{(1-f') C_{FeB} N_{Fe}}{D_n} + \frac{f' C_{Fei} N_{Fe}}{D_n} + \frac{1}{L_{others}^2} + \frac{1}{L_{BO}^2} \quad (3)$$

In the above, f and f' denote the proportions of the total iron concentration in the wafer being analyzed accounted for by interstitial Fe (denoted as "Fei", hereinafter) at elapsed times $t_1$ and $t_2$, respectively:

$$f = N_{Fei}/N_{Fe} = F$$

$L_{others}$ is the minority carrier diffusion length due to causes other than Fe and B—O defects, and is assumed to remain unchanged by optical activation and the subsequent passage of time. $L_{BO}$ denotes the influence of B—O defects on the minority carrier diffusion length. It does not matter if $L_{BO}$ contains items the state of which changes with irradiation by light in addition to B—O defects. However, in the same manner as for B—O defects, it is assumed that such items are not dependent on the subsequent passage of time. $C_{FeB}$ is the electron capture coefficient of Fe—B pairs and $C_{Fei}$ is the electron capture coefficient of Fei. $D_n$ is the electron diffusion constant, and can be obtained from equation (4) if the dependence on resistivity is taken into account.

$$D_n = \frac{k_B T}{q} \mu_e \quad (4)$$

In equation (4), q denotes the electron charge, $k_B$ denotes the Boltzmann constant, and T denotes the temperature of the wafer being analyzed. μe denotes the dependence on resistivity of mobility in silicon, which can be obtained from equation (5) as described in "C. Jacoboni, Solid-State Electronics, vol. 20, pp. 77-89, 1977", which is expressly incorporated herein by reference in its entirety.

$$\mu_e = \frac{1360}{1 + (N_B/N_{ref})^\alpha} \quad (5)$$

In equation (5), $N_B$ denotes the boron concentration in the wafer being analyzed; the values of the fitting parameters are $N_{ref}=1.0\times10^{17}$ (cm$^3$) and α=0.5. By substituting this equation into equation (4), it is possible to obtain the dependence on resistivity of the electron diffusion coefficient. The technique of obtaining the electron diffusion coefficient from the mobility given the dependence on resistivity is commonly employed in this field.

Thus, solving equations (2) and (3) for Fe concentration $N_{Fe}$ gives equation (6).

$$N_{Fe} = \frac{D_n}{F_{AF2} - F_{AF1}} \left( \frac{1}{C_{FeB} - C_{Fei}} \right) \left( \frac{1}{L_{AF1}^2} - \frac{1}{L_{AF2}^2} \right) \quad (6)$$

In equation (6), $N_{Fe}$ denotes the iron concentration, $F_{AF1}$ denotes the dependence on time of recombination of Fe—B pairs calculated from equation (1) at the time of measurement of $L_{AF1}$, $F_{AF2}$ denotes the dependence on time of recombination of Fe—B pairs calculated from equation (1) at the time of measurement of $L_{AF2}$, $C_{FeB}$ denotes an electron capture coefficient of Fe—B pairs, $C_{Fei}$ denotes an electron capture coefficient of Fei, and $D_n$ denotes an electron diffusion constant.

In equation (6), known values such as values described in journal articles can be employed for $C_{FeB}$ and $C_{Fei}$. To further enhance analysis precision, for test wafers of known iron concentration in which the iron concentration has been measured by the DLTS method or the like in advance, fitting can be conducted so that the known iron concentration matches the iron concentration obtained from equation (6), and $C_{FeB}$ and $C_{Fei}$ can be determined. Once $C_{FeB}$ and $C_{Fei}$ have been determined, the Fe concentration $N_{Fe}$ can be obtained by substituting $F_{AF1}$ and $F_{AF2}$, $L_{AF1}$ and $L_{AF2}$ measured by the SPV method, electron diffusion constant $D_n$, obtained from the above equations, temperature T of the wafer being analyzed, and boron concentration $N_B$ of the wafer into equation (6). As shown in equation (1), $F_{AF1}$ and $F_{AF2}$ are determined by $N_B$, $t_1$, and $t_2$. That is, by means of equation (6), the iron concentration of the wafer being analyzed can be obtained from measured values of diffusion lengths $L_{AF1}$ and $L_{AF2}$, the times $t_1$ and $t_2$ elapsing from irradiation with light to measurement of diffusion length, the temperature T of the wafer being analyzed at the time of measurement, and the boron concentration $N_B$ of the wafer. Since equation (6) is derived using equations (2) and (3), the influence exerted by B—O defects on diffusion lengths $L_{AF1}$ and $L_{AF2}$ can be excluded. Additionally, since change in the diffusion length due to the dependence on time of recombination of Fe—B pairs is taken into account in equation (1), by using equation (6), it is possible to analyze the iron concentration with greater sensitivity than by the conventional measurement method, which does not exclude the influence of B—O defects, without waiting for restoration of the Fe—B pairs.

An embodiment of calculating the iron concentration with equation (6) has been described. However, the analyzing method of the present invention is not limited to that embodiment. Any calculation equation that is derived by a known method of derivation can be employed without limitation so long as it is capable of taking into account the dependence on time of recombination of Fe—B pairs separated by separation processing based on irradiation with light and the influence of B—O defects formed by irradiation with light.

For example, the analyzing method of the present invention can be applied to boron-doped p-type silicon wafers such as silicon wafers (known as $p^+$ wafers) with boron (dopant) concentrations of about $10^{16}$ to $10^{19}$ atms/cm$^3$ and resistivities of more than 10 mΩ·cm to about 1,000 mΩ·cm and silicon wafers (known as $p^-$ wafers) with boron concentrations of equal to or lower than $10^{16}$ atmos/cm$^3$ and resistivities of exceeding about 1 Ω·cm. Further, since the present invention can exclude the influences exerted on the calculated value by the formation of B—O defects, it is desirably applied to wafers in which large numbers of B—O defects tend to form, that is, wafers containing relatively numerous interstitial oxygen atoms. From this perspective, the present invention is suited to application to silicon wafers with interstitial oxygen concentrations of equal to or higher than $1 \times 10^{18}$ atoms/cm$^3$ (according to old ASTM). However, the precision of the level of the iron concentration measured by the conventional method may decrease by the magnitude of the influence of the B—O defects formed even in high-purity wafers with little iron contamination and low concentrations of interstitial oxygen. From that perspective, the present invention can be effectively applied even to wafers with interstitial oxygen concentrations of lower than $1 \times 10^{18}$ atoms/cm$^3$ (according to old ASTM) as well as with little iron concentrations (such as iron concentrations on the order of $10^9$ and below).

A further aspect of the present invention relates to an analysis device for use in the analysis method of the present invention, comprising a light irradiating part that irradiates light, a measuring part that measures the diffusion length, and a displacement means that displaces the silicon wafer being analyzed between the measurement part and the light irradiating part. The analyzing method of the present invention can be automated with the above analysis device. Thus, use of the above analysis device makes it possible to continuously analyze multiple silicon wafers. It is further possible to rapidly process multiple wafers in parallel by separately configuring a measuring part and a light irradiating part so that while determining the measurement value of the diffusion length of a given silicon wafer, another silicon wafer is irradiated with light to separate Fe—B pairs.

Figure 1:
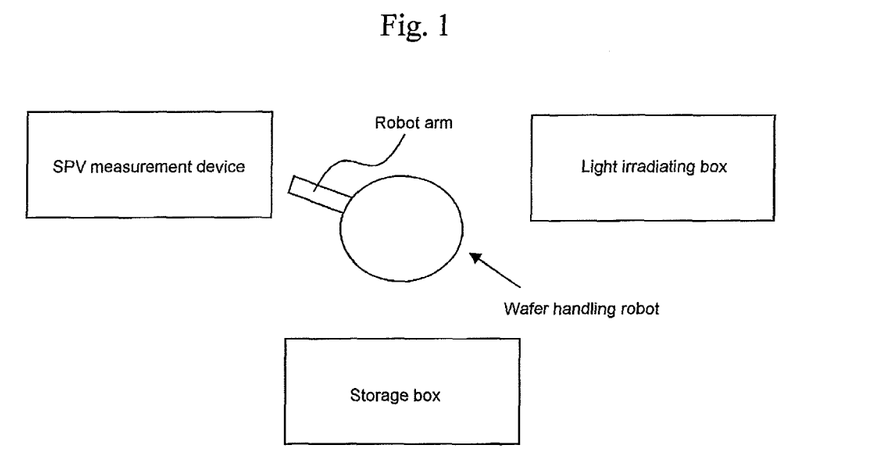
FIG. 1 shows an example of the analysis device for use in the present invention.

For example, two SPV measuring devices can be installed as the measuring part and light irradiating part in the above analysis device, with one being employed as the measuring part and the other as the light irradiating part in a light irradiating mechanism that is built into the device to irradiate light to separate Fe—B pairs. A displacement means, displacing silicon wafers being measured from the measuring part to the light irradiating part, can be employed in the form of a conveyor belt, robot arm, or the like. As needed, in addition to the measuring part and light irradiating part, a wafer waiting part (such as a chamber or box) can be provided, with the displacement means displacing the wafer to the wafer waiting part from the measuring part or light irradiating part. The wafer waiting part can be used as a space for allowing the wafer to stand until $L_{AF2}$ measurement following measurement of minority carrier diffusion length $L_{AF1}$. FIG. 1 shows an example of such a device. In FIG. 1, an SPV measurement device corresponds to the measuring part, a light irradiating box to the light irradiating part, and a storage box to the wafer waiting part. Wafers can be displaced between the various parts by a wafer handling robot positioned in the center.

The present invention further relates to a silicon wafer to which a written quality guarantee is attached. The iron concentration determined by the analyzing method of the present invention is recorded on the written quality guarantee. The silicon wafer with a written quality guarantee recording the iron concentration determined by the analyzing method of the present invention can assure quality by means of a highly reliable analysis value in which the influence of B—O defects has been reduced or eliminated. Thus, it can be used for various applications such as device fabrication with high reliability. The written quality guarantee can be provided to the user along with the silicon wafer by means of adhesion to the surface of the packaging of the silicon wafer, for example.

A still further aspect of the present invention relates to a method of manufacturing a boron-doped p-type silicon wafer comprising: preparing a lot of silicon wafers containing multiple boron-doped p-type silicon wafers; extracting at least one silicon wafer from the lot; determining an iron concentration of the silicon wafer that has been extracted by the analyzing method of the present invention; and shipping a silicon wafer as a product wafer, the silicon wafer being within the same lot as the extracted silicon wafer the iron concentration of which has been determined to be at or below a threshold. In the manufacturing method of the present invention, the iron concentration of the silicon wafer that has been extracted is determined by the analyzing method of the present invention.

As set forth above, the analyzing method of the present invention permits the high-precision measurement of the iron concentration of a silicon wafer while reducing or eliminating the influence of B—O defects. Thus, high-quality product wafers can be provided with high reliability by shipping product wafers in the form of silicon wafers in the same lot as a silicon wafer in which the iron contamination level has been determined to be at or below a threshold by the analyzing method of the present invention, that is, a silicon wafer in which the iron contamination level has been determined to be non-defective. The criterion (threshold) for determining non-defective product can be set taking into account the physical properties required of the wafer based on the wafer application or the like. The number of wafers per lot and the number of wafers extracted can also be suitably set.

EXAMPLES

The present invention will be described in detail below based on examples. However, the present invention is not limited to the examples. The boron concentration described below is a value converted from the resistivity obtained by the four-probe method. The interstitial oxygen concentration is a value (according to old ASTM) determined by Fourier transform infrared spectrometer (FTIR).

1. Confirming the Influence of the Formation of B—O Defects on Measurement Values The iron concentration of individual CZ silicon wafers (200 mm in diameter, 725 μm in thickness) fabricated under conditions of differing boron concentration and oxygen concentration with iron contamination levels deemed to be of nearly identical level was measured in a SEMI-compliant standard measurement mode taking into account recombination of the carrier on the reverse side of the wafer using a minority carrier diffusion length measuring device in the form of a surface photovoltage (SPV) measurement device (FAaST330-SPV made by SDI). Fe—B pair separation processing was conducted for two minutes at an irradiation intensity of 6 W/cm² with a light irradiating mechanism that was built into the device. Prior to measurement, the silicon wafer was immersed for five minutes in a 5 weight percent HF solution to remove the natural oxide film, rinsed with ultrapure water for 10 minutes, dried, and left standing for one week in the atmosphere of a clean room as preprocessing for measurement.

Equation (A) below, normally employed in the SPV method, was used to calculate the iron concentration.

$$[Fe] = C \times (L_2^{-2} - L_1^{-2}) \quad (A)$$

[In equation (A), [Fe] denotes the Fe concentration (/cm³), $L_1$ denotes the minority carrier diffusion length (μm) before irradiation with light, and $L_2$ denotes the minority carrier diffusion length (μm) following irradiation with light. The commonly employed value of $1 \times 10^{16}$ μm²cm⁻³ was employed as coefficient C.]

Figure 2:
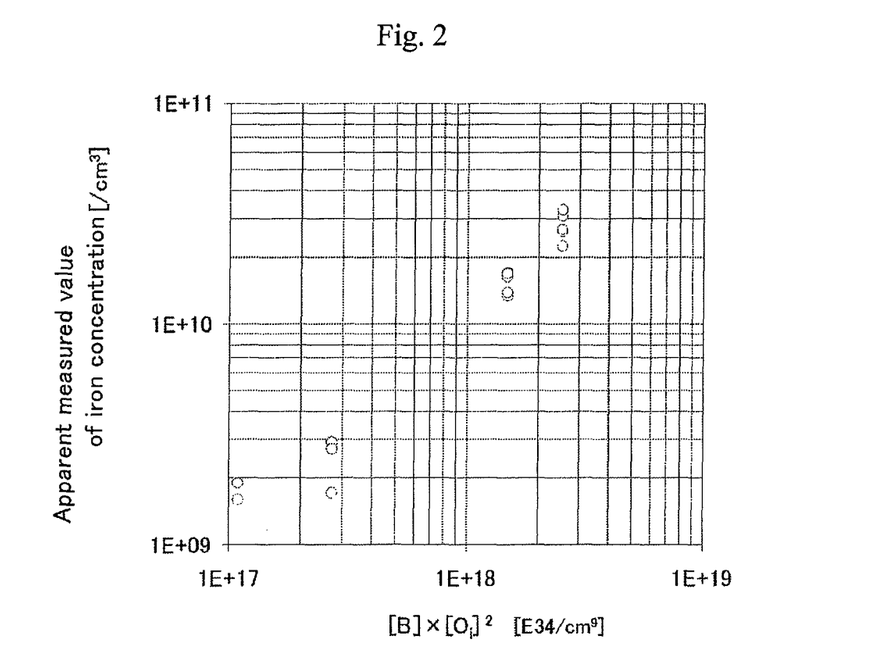
FIG. 2 is a graph showing the correlation of the iron concentration obtained by the SPV method with the product of the boron concentration [B] and the square of the interstitial oxygen (Oi) concentration [Oi]: [B]×[Oi]$^2$.

In the field of solar cells, the level of generation of B—O defects is reported to be proportional to the boron concentration and proportional to the square of the interstitial oxygen (Oi) concentration. Thus, FIG. 2 shows a graph of the iron concentration obtained by the SPV method plotted against the product of the boron concentration [B] and the square of the interstitial oxygen (Oi) concentration [Oi]: $[B] \times [Oi]^2$.

FIG. 2 confirms that there was a strong correlation between the iron concentration that was measured (the apparent iron concentration) and $[B] \times [Oi]^2$. This meant that when the iron concentration was measured by the conventional SPV method, the generation of B—O defects ended up causing a high iron concentration to be calculated. The influence of B—O defects became more pronounced the lower the iron concentration of the wafer. Thus, for example, in high-purity wafers with iron concentrations on the order of $10^9$ or less, the influence of the formation of B—O defects on the measurement value was considered to be non-negligible. In particular, in wafers with low iron concentrations and high boron concentrations (such as boron concentrations in the vicinity of $1 \times 10^{16}$/cm³ or higher), there was a risk that the SPV measurement value would end up depending simply on the generation of B—O defects.

2. Formation of B—O Defects by Irradiation with Light

Figure 3:
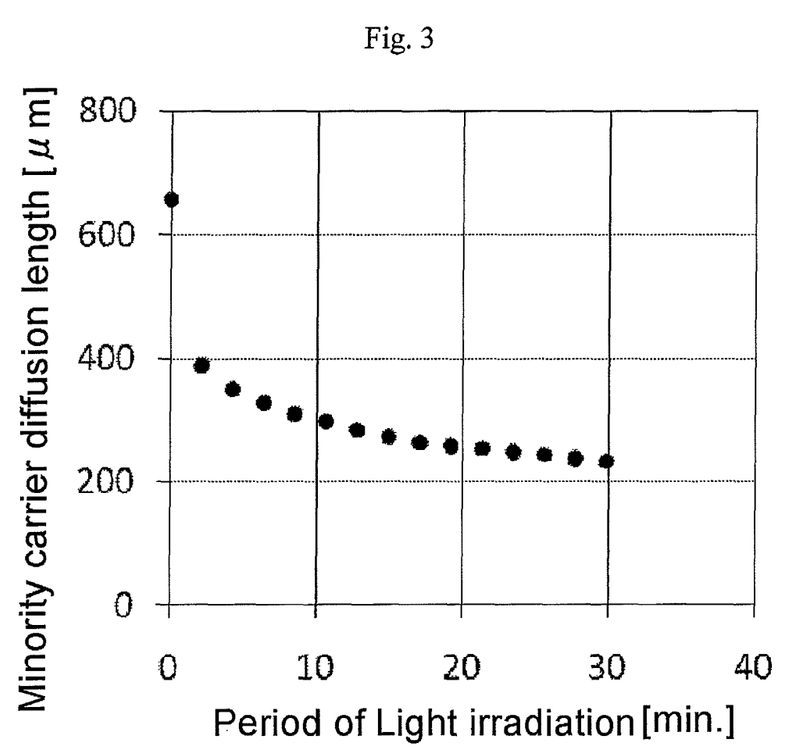
FIG. 3 is a graph showing the change over time in the minority carrier diffusion length by irradiation with light at 6 W/cm$^2$.

After continuously irradiating the surface of a p-type silicon wafer (200 mm in diameter, 725 μm in thickness) with an interstitial oxygen concentration of $1 \times 10^{18}$ atms/cm³, a boron concentration of $1.2 \times 10^{16}$ atms/cm³, and trace Fe contamination with white light at an irradiation intensity of 6 W/cm² with a light irradiating mechanism that was built into an SPV measurement device, the minority carrier diffusion length was determined by the same method as in 1. above. FIG. 3 shows the results of continuous alternating measurement of the minority carrier diffusion length and light irradiation.

The separation of Fe—B pairs occurred in addition to the formation of B—O defects due to light irradiation. However, the separation of Fe—B pairs concluded in about 1 to 2 minutes at the above irradiation intensity, so the drop in the diffusion length following the conclusion of separation of Fe—B pairs in FIG. 3 was entirely due to the influences of the formation of B—O defects. When irradiation was continued for about 15 minutes, the drop in the minority carrier diffusion length slackened off. Thus, irradiation with light for 15 minutes or more at the above irradiation intensity was determined to cause the formation of B—O defects to reach a state of saturation.

Figure 4:
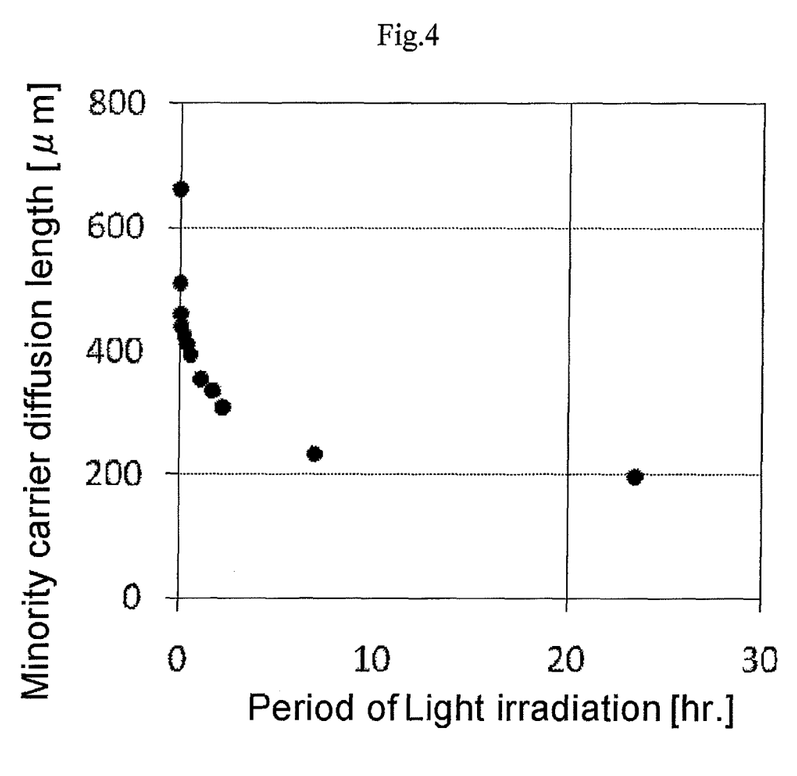
FIG. 4 is a graph showing the change over time in the minority carrier diffusion length by irradiation with light at 30 mW/cm$^2$.

FIG. 4 shows results obtained by the same operation as above while changing the intensity of the white light irradiated to 30 mW/cm². The drop in the minority carrier diffusion length slackened off at about 10 hours in the irradiation time. Thus, irradiation with light of this irradiation intensity for 10 hours or more was confirmed to cause the formation of B—O defects to attain a state of saturation.

3. Confirming the Stability of B—O Defects

The surface of a p-type silicon wafer (200 mm in diameter, 725 μm in thickness) with an interstitial oxygen concentration of $1 \times 10^{18}$ atms/cm³, a boron concentration of $1.2 \times 10^{16}$ atms/cm³, and trace Fe contamination was irradiated with white light at an irradiation intensity of 6 W/cm² for 15 hours in the same manner as in 2. above. The silicon wafer, in which the B—O defects were generated and the minority carrier diffusion length dropped due to irradiation with light, was left standing for about three days at room temperature (about 25° C.).

Figure 5:
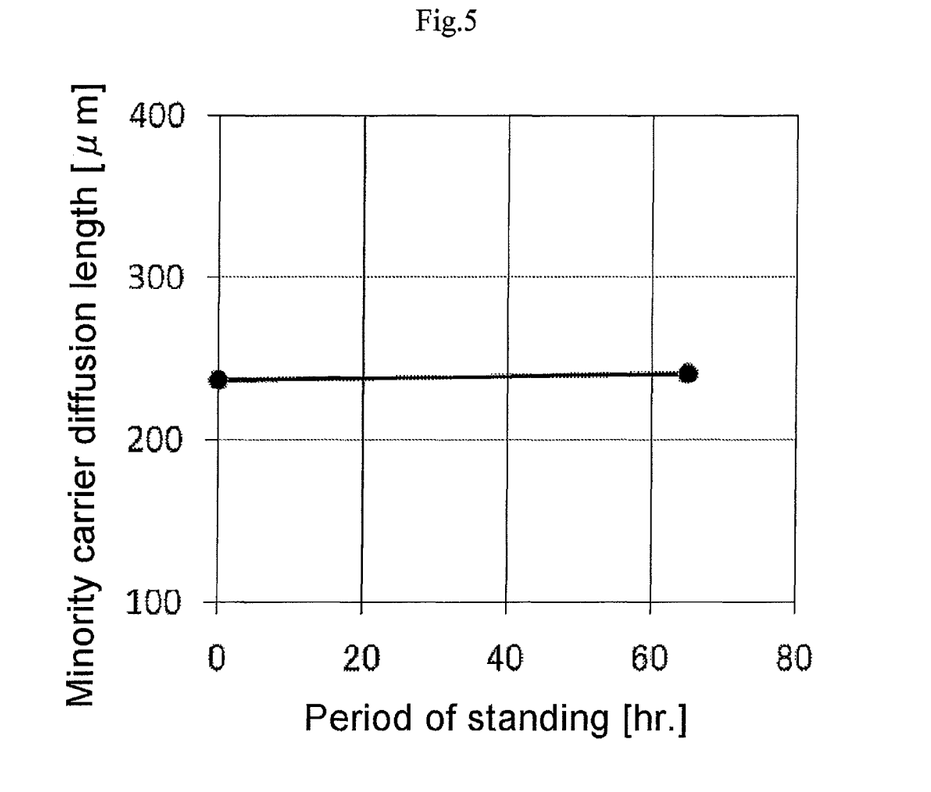
FIG. 5 is a graph showing the change over time in the minority carrier diffusion length when placed at room temperature following irradiation with light at 6 W/cm$^2$.

FIG. 5 shows the minority carrier diffusion length of the silicon wafer in the initial period of standing at room temperature. The minority carrier diffusion length was measured by the same method as in 1. above. Since almost no change in the minority carrier diffusion length is exhibited in FIG. 5, the B—O defects that were once generated were confirmed to remain present in stable fashion following generation. The silicon wafer employed here was of extremely high purity with only trace Fe contamination. Thus, almost no change was found in the minority carrier diffusion length accompanying recombination of the Fe—B pairs.

Example 1

The iron concentration of multiple p-type silicon wafers (200 mm in diameter, 725 μm in thickness) with boron concentrations ranging from $1 \times 10^{15}$ to $1 \times 10^{16}$ atms/cm³ and interstitial oxygen concentrations ranging from $1 \times 10^{18}$ to $1.5 \times 10^{18}$ atms/cm³ was determined by the following method.

(I) Each silicon wafer was irradiated for 15 minutes with white light at an irradiation intensity of 6 W/cm².

(II) The minority carrier diffusion length was measured by the same method as in 1. above (wafer temperature at time of measurement: 25° C.) 10 minutes and 30 minutes after the irradiation with light of (I) above, and the iron concentration was calculated using equation (6) above.

Comparative Example 1

The iron concentration of multiple p-type silicon wafers (200 mm in diameter, 725 μm in thickness) with boron concentrations ranging from $1 \times 10^{15}$ to $1 \times 10^{16}$ atms/cm³ and interstitial oxygen concentrations ranging from $1 \times 10^{18}$ to $1.5 \times 10^{18}$ atms/cm³ was determined by the same method as in 1. above using equation (A).

Figure 6:
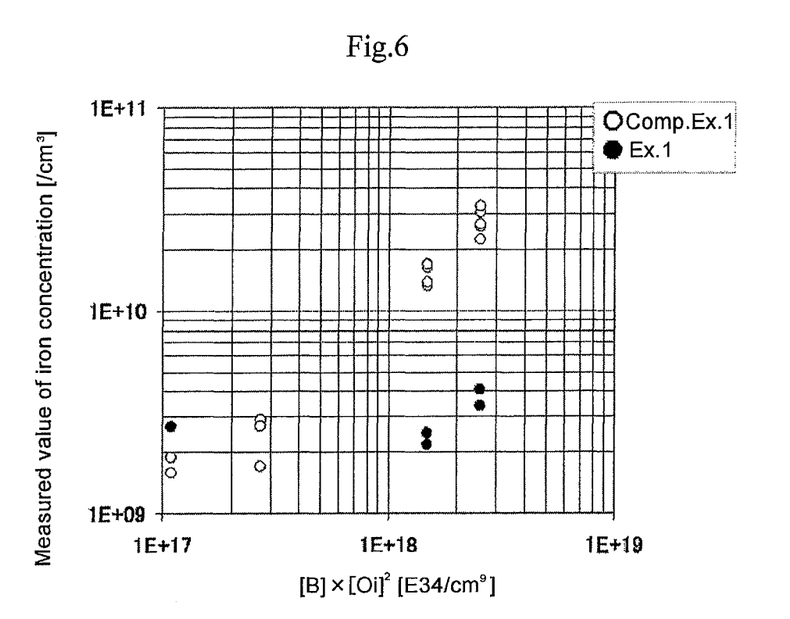
FIG. 6 is a graph of a plot of the iron concentrations obtained in Example 1 and Comparative Example 1 against the product of the boron concentration [B] and the square of the interstitial oxygen (Oi) concentration [Oi]: [B]×[Oi]$^2$.

FIG. 6 shows a plot of the iron concentrations obtained against the product of the boron concentration [B] and the square of the interstitial oxygen (Oi) concentration [Oi]: $[B] \times [Oi]^2$.

The silicon wafers employed in Example 1 and Comparative Example 1 had differing boron concentrations and interstitial oxygen concentrations but were manufactured with an almost identical degree of cleanliness. Thus, the iron concentrations were of the same level. As shown in FIG. 6, the iron concentration that was calculated in Comparative Example 1 increased with the boron concentration and interstitial oxygen concentration of the wafer (increased with $[B]\times[Oi]^2$ of the wafer). By contrast, the iron concentration that was calculated in Example 1 remained almost constant regardless of the boron concentration and interstitial oxygen concentration.

These results indicate that while the formation of B—O defects controlled the apparent iron concentration in Comparative Example 1, the influence of the formation of B—O defects was excluded in Example 1, and a more accurate iron concentration was confirmed to have been obtained.

The analyzing method of the present invention is useful in the quality management of silicon wafers.

Although the present invention has been described in considerable detail with regard to certain versions thereof; other versions are possible, and alterations, permutations and equivalents of the version shown will become apparent to those skilled in the art upon a reading of the specification and study of the drawings. Also, the various features of the versions herein can be combined in various ways to provide additional versions of the present invention. Furthermore, certain terminology has been used for the purposes of descriptive clarity, and not to limit the present invention. Therefore, any appended claims should not be limited to the description of the preferred versions contained herein and should include all such alterations, permutations, and equivalents as fall within the true spirit and scope of the present invention.

Having now fully described this invention, it will be understood to those of ordinary skill in the art that the methods of the present invention can be carried out with a wide and equivalent range of conditions, formulations, and other parameters without departing from the scope of the invention or any Examples thereof.

All patents and publications cited herein are hereby fully incorporated by reference in their entirety. The citation of any publication is for its disclosure prior to the filing date and should not be construed as an admission that such publication is prior art or that the present invention is not entitled to antedate such publication by virtue of prior invention.

What is claimed is:

1. A method of analyzing an iron concentration of a boron-doped p-type silicon wafer by a surface photovoltage method, which comprises:
    subjecting the boron-doped p-type silicon wafer to Fe—B pair separation processing by irradiation with light, and
    determining the iron concentration based on a change in a minority carrier diffusion length following the Fe—B pair separation processing, wherein
    the iron concentration is calculated with a calculation equation, the calculation equation comprising parameters in the form of a minority carrier diffusion length $L_{AF1}$ measured after the separation processing, a minority carrier diffusion length $L_{AF2}$ measured after a prescribed time has elapsed following measurement of $L_{AF1}$, and dependence on time of recombination of Fe—B pairs that have been separated by the separation processing, and
    the calculation equation is derived by assuming that the irradiation with light causes boron atoms and oxygen atoms that are present in the silicon wafer to form a bonded product, and by assuming that the bonded product has identical influences on $L_{AF1}$ and $L_{AF2}$.

2. The method of analyzing according to claim 1, wherein the calculation equation is the following equation (6):

$$N_{Fe} = \frac{D_n}{F_{AF2} - F_{AF1}} \left( \frac{1}{C_{FeB} - C_{Fei}} \right) \left( \frac{1}{L_{AF1}^2} - \frac{1}{L_{AF2}^2} \right) \quad (6)$$

wherein, in equation (6), $N_{Fe}$ denotes the iron concentration, $F_{AF1}$ denotes the dependence on time of recombination of Fe—B pairs calculated from the following equation (1) at the time of measurement of $L_{AF1}$, $F_{AF2}$ denotes the dependence on time of recombination of Fe—B pairs calculated from the following equation (1) at the time of measurement of $L_{AF2}$, $C_{FeB}$ denotes an electron capture coefficient of Fe—B pairs, $C_{Fei}$ denotes an electron capture coefficient of Fei, and $D_n$ denotes an electron diffusion constant;

$$F = \exp(-\tau_C^{-1} t) \quad (1)$$

wherein, in equation (1), F denotes dependence on time of recombination of Fe—B pairs, τc denotes a capture ratio, and t denotes a passage of time following irradiation with light.

3. The method of analyzing according to claim 1, wherein the method is conducted with an analysis device comprising a light irradiating part that irradiates the light, a measuring part that measures the diffusion length, and a displacement means that displaces the silicon wafer being analyzed between the measurement part and the light irradiating part.

4. A silicon wafer to which a written quality guarantee is attached, wherein an iron concentration determined by the method of analyzing according to claim 1 is recorded on the written quality guarantee.

5. A method of manufacturing a boron-doped p-type silicon wafer, which comprises:
    preparing a lot of silicon wafers containing multiple boron-doped p-type silicon wafers;
    extracting at least one silicon wafer from the lot;
    determining an iron concentration of the silicon wafer that has been extracted by the method of analyzing according to claim 1; and
    shipping a silicon wafer as a product wafer, the silicon wafer being within the same lot as the extracted silicon wafer the iron concentration of which has been determined to be at or below a threshold.

* * * * *